US007068482B2

United States Patent
Chen

(10) Patent No.: US 7,068,482 B2
(45) Date of Patent: Jun. 27, 2006

(54) BICMOS ELECTROSTATIC DISCHARGE POWER CLAMP

(75) Inventor: Shiao-Shien Chen, Chung-Li (TW)

(73) Assignee: United Microelectronics Corp., Hsin-chu (TW)

( * ) Notice: Subject to any disclaimer, the term of this patent is extended or adjusted under 35 U.S.C. 154(b) by 370 days.

(21) Appl. No.: 10/387,555

(22) Filed: Mar. 14, 2003

(65) Prior Publication Data
US 2004/0179314 A1    Sep. 16, 2004

(51) Int. Cl.
*H02H 9/00* (2006.01)
(52) U.S. Cl. ...................................... 361/56
(58) Field of Classification Search ................. 361/56, 361/91.1, 111; 257/173, 355
See application file for complete search history.

(56) References Cited

U.S. PATENT DOCUMENTS

| 5,982,217 | A  | * | 11/1999 | Chen et al. ................. 327/321 |
| 6,369,994 | B1 | * | 4/2002  | Voldman ....................... 361/56 |
| 6,392,860 | B1 | * | 5/2002  | Lin et al. ..................... 361/111 |
| 6,465,768 | B1 | * | 10/2002 | Ker et al. ................... 250/214.1 |
| 6,566,715 | B1 | * | 5/2003  | Ker et al. .................... 257/355 |
| 6,591,233 | B1 | * | 7/2003  | Sonoda ........................ 703/14 |
| 6,600,356 | B1 | * | 7/2003  | Weiss ......................... 327/310 |
| 6,639,283 | B1 | * | 10/2003 | Hung et al. .................. 257/355 |
| 6,667,867 | B1 | * | 12/2003 | Vashchenko et al. ...... 361/91.1 |

OTHER PUBLICATIONS

Adel S. Sedra and Kenneth C. Smith "Microelectronic Circuits" CBS College Publishing 1987 pp. 342-345.*

* cited by examiner

*Primary Examiner*—Stephen W. Jackson
*Assistant Examiner*—Boris Benenson
(74) *Attorney, Agent, or Firm*—Nixon & Vanderhye PC

(57) ABSTRACT

A BiCMOS electrostatic discharge (ESD) protecting circuit is triggered by a bipolar junction transistor (BJT) for achieving ESD protection. Due to the layout area of the BJT ESD protecting circuit being smaller than the layout area of an RC circuit, layout area can be reduced. Moreover, the BJT reduces leakage current problems and has a lower triggering voltage. Therefore, the BJT in the ESD protecting circuit can effectively reduce problems of a higher triggering ESD voltage and leakage current.

25 Claims, 8 Drawing Sheets

BICMOS ELECTROSTATIC DISCHARGE POWER CLAMP

BACKGROUND OF THE INVENTION

1. Field of the Invention

This invention generally relates to the field of electrostatic discharge (ESD) protection of a metal oxide semiconductor (MOS). More particularly, the present invention relates to ESD protection of a BiCMOS.

2. Description of the Prior Art

An ESD event is the main reason resulting in the majority of electronic parts or systems damaged by an electrostatic overstress (EOS). This kind of damage makes semiconductor parts and computer systems damaged forever, affecting the functionalities of integrated circuits (ICs), and causes electronic products work abnormally. However, the damage caused from ESD is mostly produced by human beings, and is also difficult to avoid. Electrostatic energy can accumulate in human beings, apparatuses, storing devices, and even electronic parts or systems themselves during the processes of manufacture, assembly, testing, storage and shipping. Without the desire, people provide a discharge path by contacting those objects to each other and damage the electronic parts or systems by an ESD event.

According to the produced reasons and discharging methods to ICs, electrostatic energy can be categorized into four categories: human-body model (HBM), machine model (MM), charged-device model (CDM), and field-induced model (FIM). Take HBM for example, a business IC has 2000V ESD voltages and assuming an equivalent body resistance of a human being is 1500 Ω, and hence the ESD current is about 1.3 amps. Therefore, an ESD protecting circuit is fabricated within an IC in order to protect the IC from the ESD damage. The ESD protecting circuit is a special circuit for ESD protection, providing an ESD path for discharge current, and keeps the discharge current from flowing into the inner circuit of the IC to cause damage. The ESD of both HBM and MM is caused from external environments, and hence ESD protecting circuits are fabricated beside pads. Those output pads of PMOS and NMOS with big dimensions could be used as ESD protecting parts. Since the input pads of CMOS ICs are commonly connected with the gates of MOS parts and the gate oxide layer is the easiest to be penetrated by an ESD, a set of ESD protecting circuit is fabricated beside the input pads to protect the input parts. The ESD protecting circuits are also fabricated beside the pads of VDD and VSS since both of them may be discharged by ESD events.

A traditional ESD protecting circuit of a MOS is shown in FIG. 1A, where the general triggering voltage of the MOS 10 is around 10V. While the voltage across the MOS 10 exceeds 10V, the MOS enters a snapback region that leads electrostatic charges out to protect the inner circuit from excessive voltage and ESD current. As shown in FIG. 1B, while the voltage V of the parasitic BJT 12 of the MOS 10 (shown in FIG. 1A) reaches Vt1, the MOS 10 enters a snapback region, and further, if the current reaches It2, the MOS 10 is burned out. By insuring that the voltage across the MOS 10 stops rising while the MOS 10 is in a snapback region, better ESD protection can be achieved.

The CMOS technique plays a main role in the semiconductor IC so far. As the manufacture processes of the CMOS IC have been gradually evolving, the dimensions of the parts have been scaled into deep-submicron to improve the performance of ICs and the operation speed, and to reduce the manufacture cost for each chip. However, the technique of advanced process mentioned above and the smaller scaled parts can make the submicron CMOS ICs reduce the capability of ESD protection, and on the other hand, electrostatic produced by external environments is still the same as before. Hence, the CMOS ICs damaged by ESD become more serious and many submicron CMOS ICs all face the same thorny problem.

To improve the performance of the ESD protecting circuit, the breakdown voltage of a zener diode is used to bias the gate or the substrate electrode of the MOS 10, as shown in FIG. 1C and FIG. 1D, thus causing the MOS to lead electrostatic charge out across a low voltage. However, the doped concentration has to be increased to achieve a zener diode with a lower breakdown voltage, and this can cause a leakage current problem. As shown in FIG. 1E, an RC circuit can be utilized to trigger the MOS 10 but the cycle of the RC circuit is longer than the cycle of ESD (take HBM for example, about 150 μs), and also results in an undue layout area. The IBM company has recently announced a SiGe heterojunction bipolar transistor (HBJ) ESD protecting circuit in the ESD Association, as shown in FIG. 1F, where a BJT that is utilized to solve the leakage current problem instead of a zener diode.

In view of the drawbacks mentioned with the prior art of ESD protection, there is a continued need to develop new and improved ESD protection that overcomes the disadvantages associated with the prior art of ESD protection.

SUMMARY OF THE INVENTION

According to the mention in the background, well-known ESD protecting circuits have the problems of a higher ESD triggering voltage, a leakage current, and an undue layout area. One object of this invention is to utilize the characteristics of the BJT to make an ESD protecting circuit have a lower triggering voltage.

Another object is to utilize the snapback status of a MOS to make ESD current flow through the substrate, and hence make the ESD protecting circuit sustain the heat resulted from ESD events.

Still another object is to utilize a BJT as a triggering element to trigger the MOS, and this can avoid the problems of leakage current and an undue layout area.

According to the objects mentioned above, the present invention discloses an ESD protecting circuit that combines a BJT with a MOS. The present invention utilizes the BJT as a triggering element. The base of the BJT is an open terminal and the MOS can be triggered by the connected method of the gate trigger, the base trigger, or the gate/base trigger. By utilizing the characteristics of the BJT, which can keep the current from leakage, and the problems associated with the prior art also can be avoided through a lower triggering voltage and a smaller layout area.

Therefore, the present invention utilizes a BJT as a triggering element to avoid the leakage current problem; moreover, the layout area is smaller than a RC triggering circuit and the triggering voltage also can be lower. Further, the ESD protecting circuit can sustain the heat resulted from ESD events while the ESD current flows through the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Further, it should be noted that the drawings are in greatly simplified form and they are not drawn to scale. Moreover, dimensions have been exaggerated in order to provide a clear illustration and understanding of the present invention.

Figure 1A:
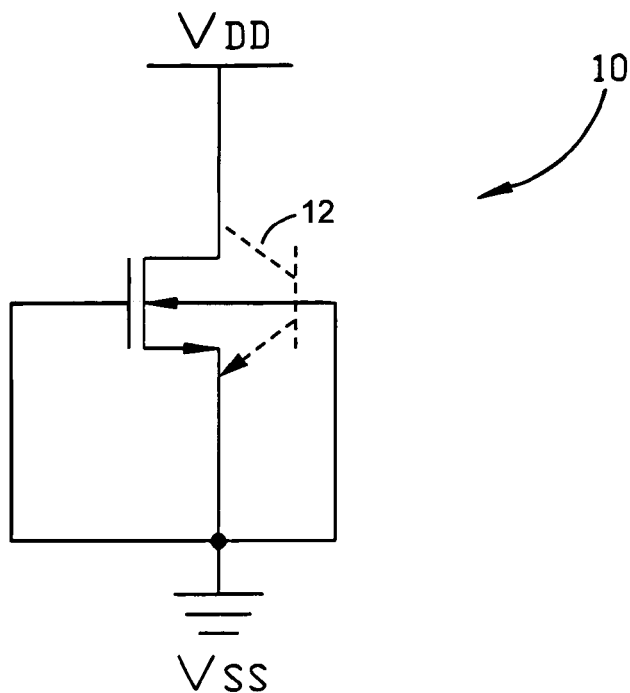
FIG. 1A and FIGS. 1C to 1F shows well-known ESD protecting circuits.
Figure 1B:
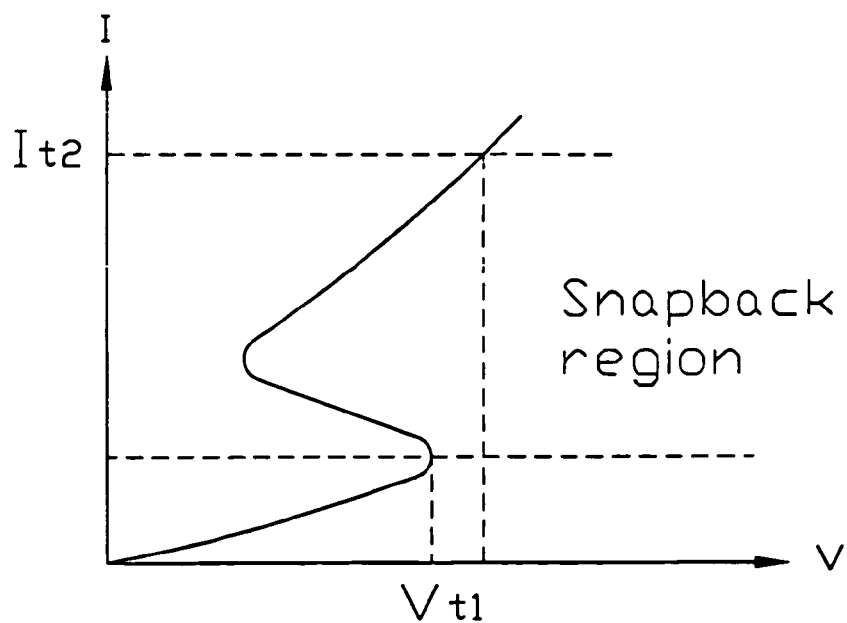
FIG. 1B shows a voltage-current relationship of the snapback of a MOS.
Figure 1C:
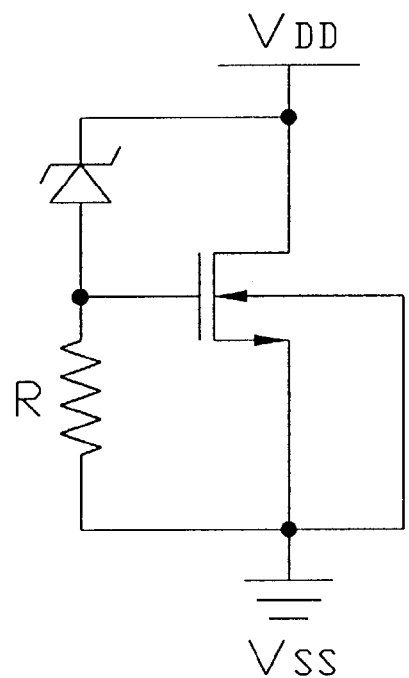
Figure 1D:
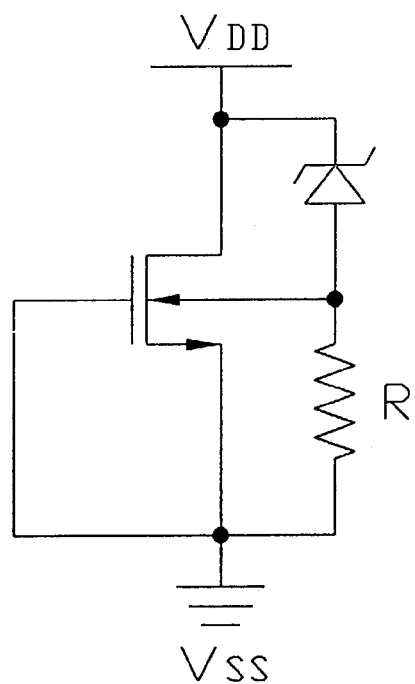
Figure 1E:
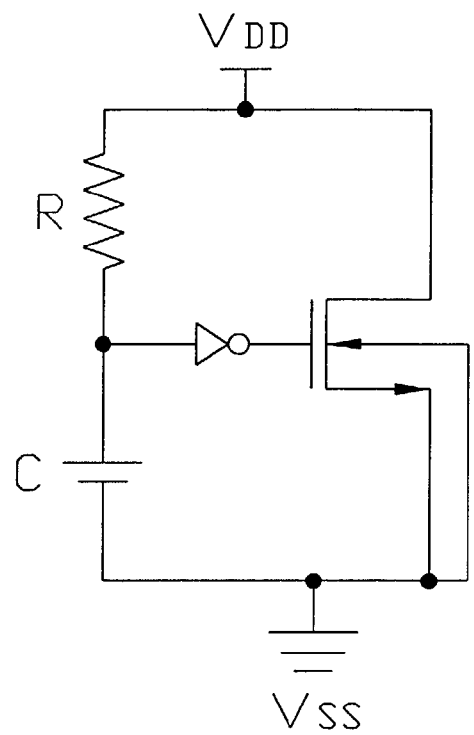
Figure 1F:
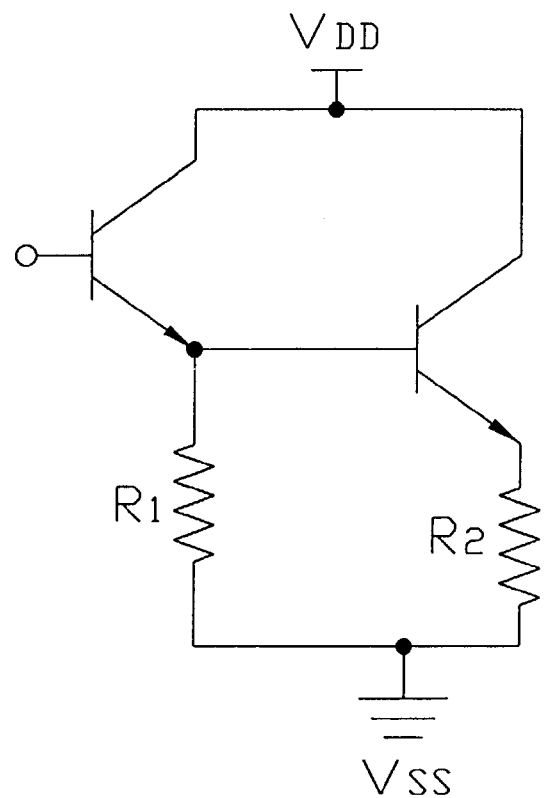
Figure 2:
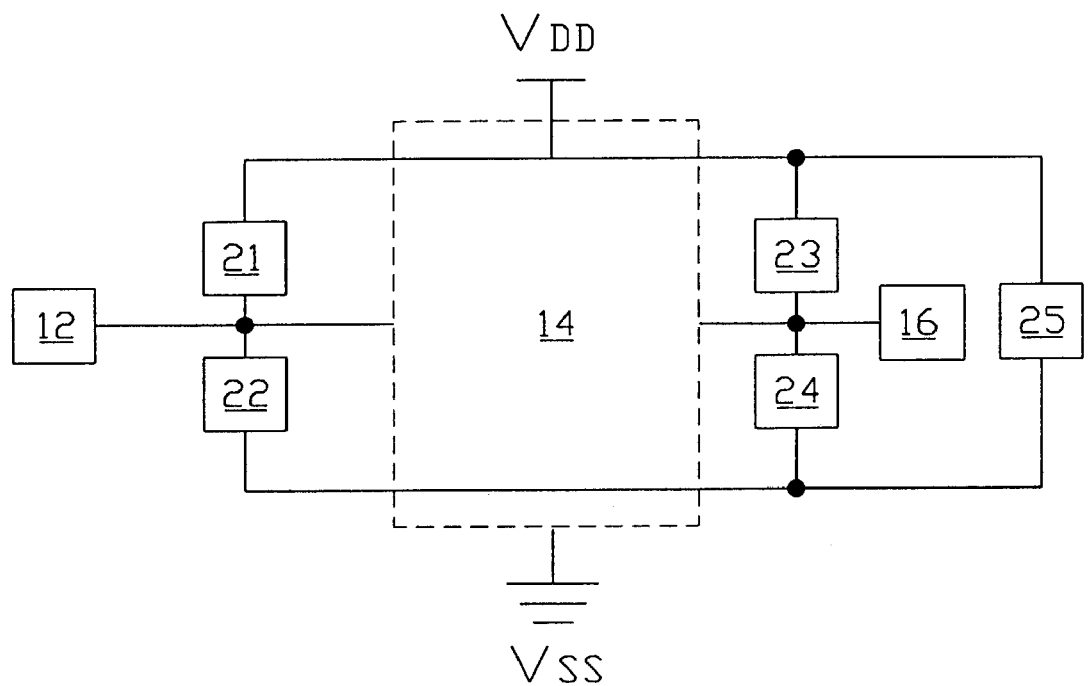
FIG. 2 shows an ESD protecting circuit schematic in an IC.

Referring to FIG. 2, an inner circuit 14 is among an input pad 12, an output pad 16, a positive voltage source VDD, and a ground VSS. Several ESD protecting circuits 21~25 are placed between the positive voltage source VDD and the ground VSS to provide effective protection against any kinds of ESD models or paths.

As for using a MOS being an ESD path, the electrostatic current of the positive voltage across drain-source can be led out while the MOS is an NMOS; the electrostatic current of the negative voltage across drain-source can be led out while using a PMOS replaces the NMOS. Therefore, one preferred embodiment described below in accordance with the present invention only adopts the NMOS for examples. However, an ESD protecting circuit can adopt an NMOS or a PMOS by depending on practical circuit designs.

Figure 3A:
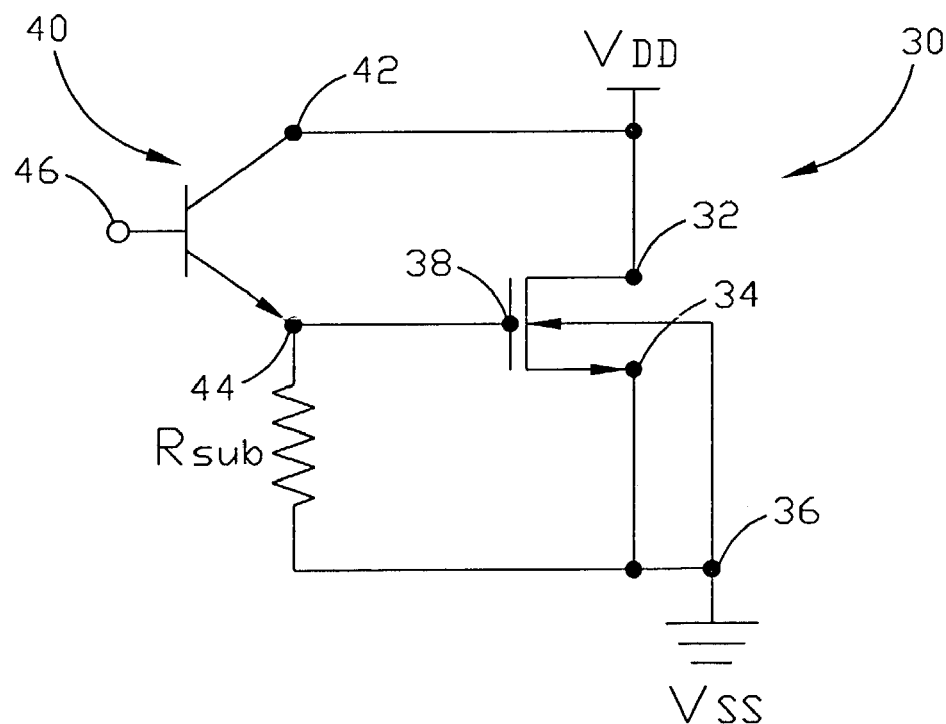
FIGS. 3A to 3B illustrates a circuit and a structure of one preferred embodiment in accordance with the present invention.
Figure 3B:
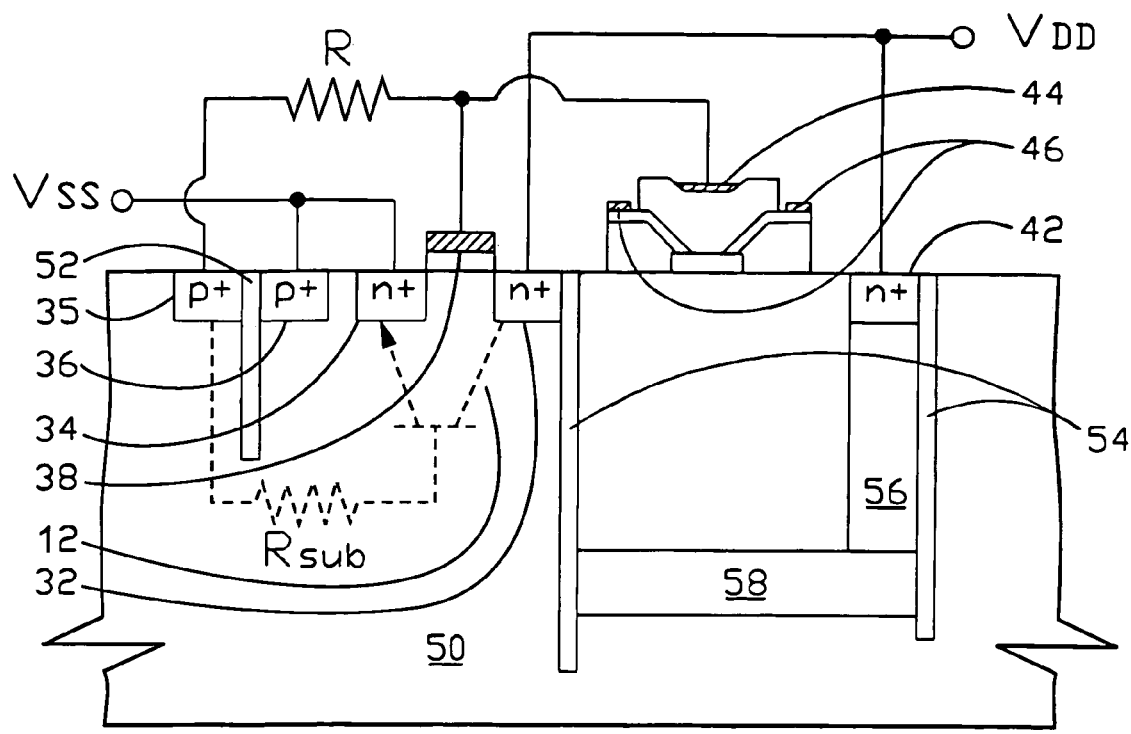

One preferred embodiment in accordance with the present invention, as shown in FIG. 3A, is a gate trigger design. A drain 32 of an NMOS 30 is connected with a positive voltage source VDD, and a source 34 and a substrate electrode 36 are connected with a ground VSS. A collector 42 of a BJT 40 is connected with the positive voltage source VDD, an emitter 44 is connected with a gate 38 of the NMOS 30, and a base 46 is an open terminal. A resistor connects the source 34 and the gate 38 of the NMOS 30. A parasitic BJT 12 is formed across the drain 32 and the source 34, and a substrate resistor Rsub is connected to the trigger 35. One possible structure is illustrated in FIG. 3B, wherein, the substrate electrode 36 and a trigger 35 of the MOS 30 have an N-well 52 between them, the BJT 40 has deep trenches 54 beside two sides thereof and an N+ buried 58 below, and a sinker 56 is below the collector 42 to collect current. The base 46 of the BJT 40 can be realized by one or two elements depending on the variation of circuit designs but there are two bases elements shown in FIG. 3B.

When an electrostatic current flows from the VDD and makes the voltage across BJT 40 to exceed the triggering voltage, the BJT 40 starts to lead the current out (the triggering voltage of the BJT 40 is lower since the base 46 of the BJT 40 is an open terminal). The current flows through the collector 42 of the BJT 40, the emitter 44, the resistor, the substrate electrode 36 of the MOS 30, and the ground VSS. A voltage across the resistor is formed and makes the parasitic N-type BJT 12 (the drain 32, the P-type substrate 50, and the source 34 form the N-type BJT 12) of the NMOS 30 enter snapback status early. By doing so, most electrostatic currents are led out through the substrate 50 and by employing wide dimensions, the substrate 50 can effectively sustain the heat resulting from the electrostatic currents.

Figure 4A:
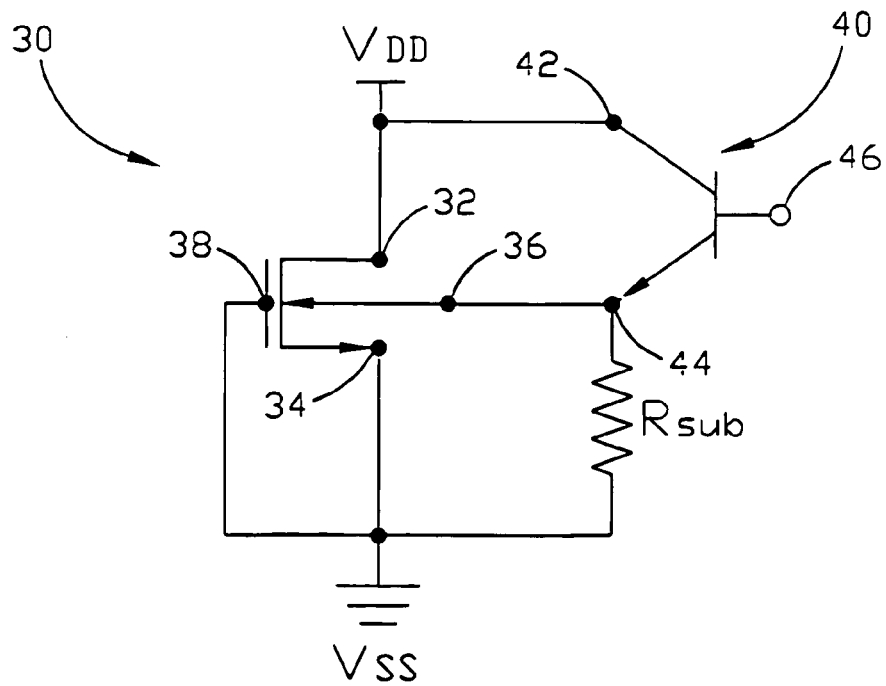
FIGS. 4A to 4B illustrates a circuit and a structure of another preferred embodiment in accordance with the present invention.
Figure 4B:
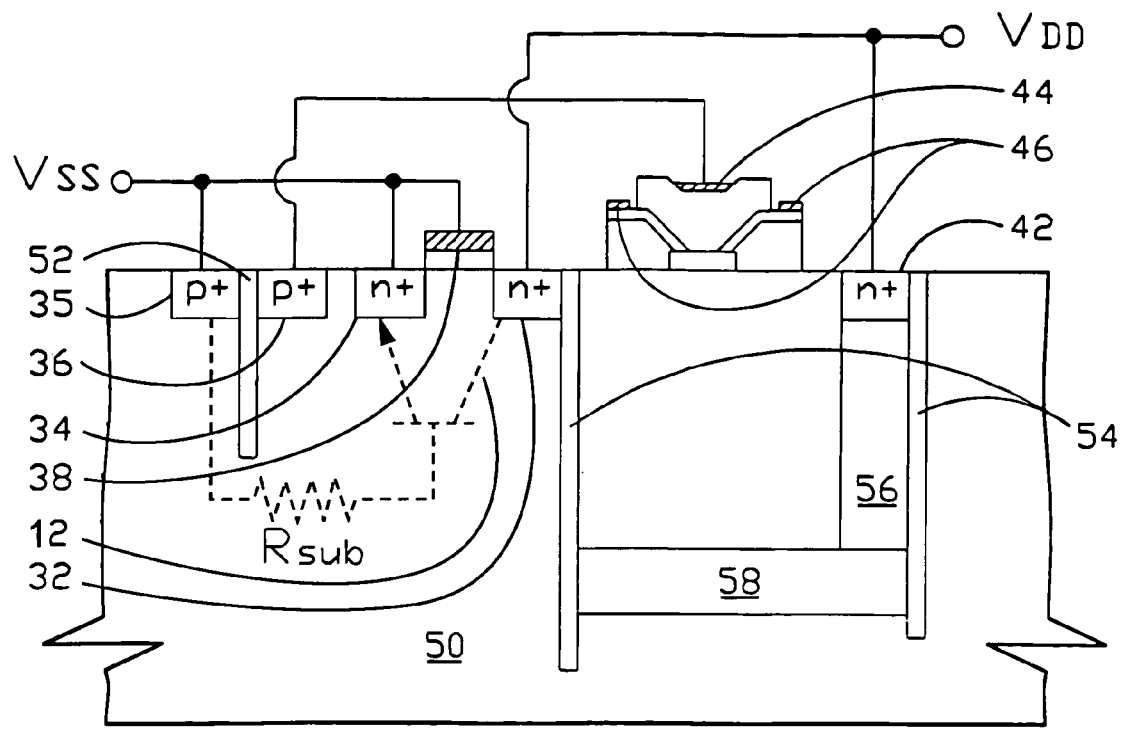

Another embodiment of the present invention, as shown in FIG. 4A, is a base trigger design and the design thereof makes the triggering voltage of an ESD protecting circuit lower. A drain 32 of an NMOS 30 is connected with a positive voltage VDD, and a source and a gate 38 are connected with a ground VSS. A collector 42 of a BJT 40 is connected with the positive voltage source VDD, an emitter 44 connected with a of the NMOS 30, and a base 46 is an open terminal. A substrate resistor Rsub connects the source 34 and the substrate electrode 36 of the NMOS 30. One possible structure is illustrated in FIG. 4B, wherein, the substrate electrode 36 and a trigger 35 of the NMOS 30 have an N-well 52 between them, the BJT 40 has deep trenches 54 beside two sides thereof and an N+ buried 58 below, and a sinker 56 is below the collector 42 to collect current. The base 46 of the BJT 40 also can be one element.

When an electrostatic current flows from the VDD, making the voltage across BJT 40 to exceed a triggering voltage, the BJT 40 starts to lead electrostatic current out. The current flows through the collector 42 of the BJT 40, the emitter 44, the substrate resistor Rsub, the substrate electrode 36 of the NMOS 30, a substrate 50, and the ground VSS. A voltage across the substrate resistor Rsub is formed and makes a voltage across the PN junction of the parasitic N-type BJT 12 (the drain 32, the P-type substrate 50, and the source 34 formed the N-type BJT 12) of the NMOS 30. This makes electrostatic current flow through parasitic N-type BJT 12 to result in the NMOS 30 entering a snapback status. By doing so, most electrostatic currents are led out through NMOS 30, and moreover, the electrostatic currents flow through the substrate 50 and by employing wide dimensions, the substrate 50 can effectively sustain the heat resulting from the electrostatic currents.

Figure 5A:
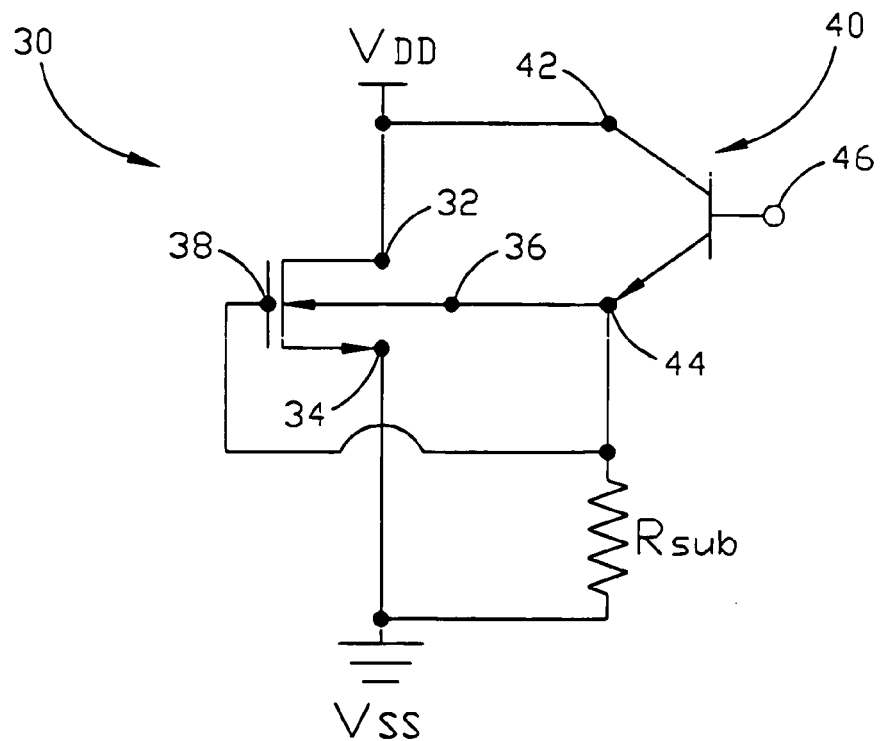
FIGS. 5A to 5B illustrates a circuit and a structure of still another preferred embodiment in accordance with the present invention.
Figure 5B:
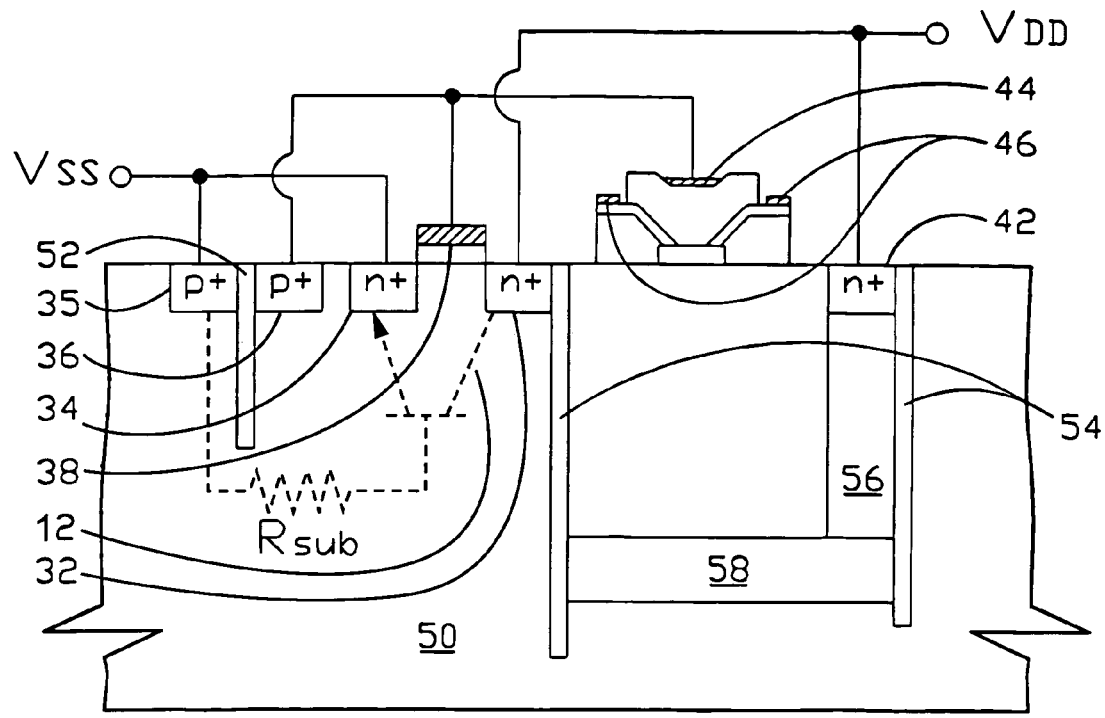

Still another preferred embodiment in accordance with the present invention, as shown in FIG. 5A, is a gate/base trigger design. A drain 32 of an NMOS 30 is connected with a positive voltage source VDD, and a source 34 is connected with a ground VSS. A collector 42 of a BJT 40 is connected with the positive voltage source VDD, an emitter 44 is connected with a gate 38 and a substrate electrode 36 of the NMOS 30, and a base 46 is an open terminal. A substrate resistor Rsub connects the source 34 and the gate 38 of the NMOS 30. One possible structure is illustrated in FIG. 5B, and wherein, the substrate electrode 36 and a trigger 35 of the NMOS 30 have an N-well 52 between them, the BJT 40 has deep trenches 54 beside two sides thereof and an N+ buried 58 below, and a sinker 56 is below the collector 42 to collect current. The base 46 of the BJT 40 also can be one element.

When an electrostatic current flows through VDD and makes the voltage across the BJT exceed a triggering voltage, BJT 40 starts to lead the current out. The current flows through collector 42 of the BJT 40, the emitter 44, the substrate resistor Rsub, the substrate electrode 36 of the NMOS 30, a substrate 50, and the ground VSS. A voltage across the substrate resistor Rsub is formed and makes a voltage across the PN junction of the parasitic N-type BJT 12 (the drain 32, the P-type substrate 50, and the source 34 formed the N-type BJT 12) of the NMOS 30. This makes electrostatic current flow through the parasitic N-type BJT 12 to result in the NMOS 30 entering a snapback status. Simultaneously, gate 38 of NMOS 30 has a bias voltage that also is of benefits to the ESD event. By doing so, most electrostatic currents are led out through NMOS 30, and moreover, electrostatic currents flow through the substrate 50 and by employing wide dimensions, substrate 50 can effectively sustain the heat resulting from the electrostatic currents.

Figure 6A:
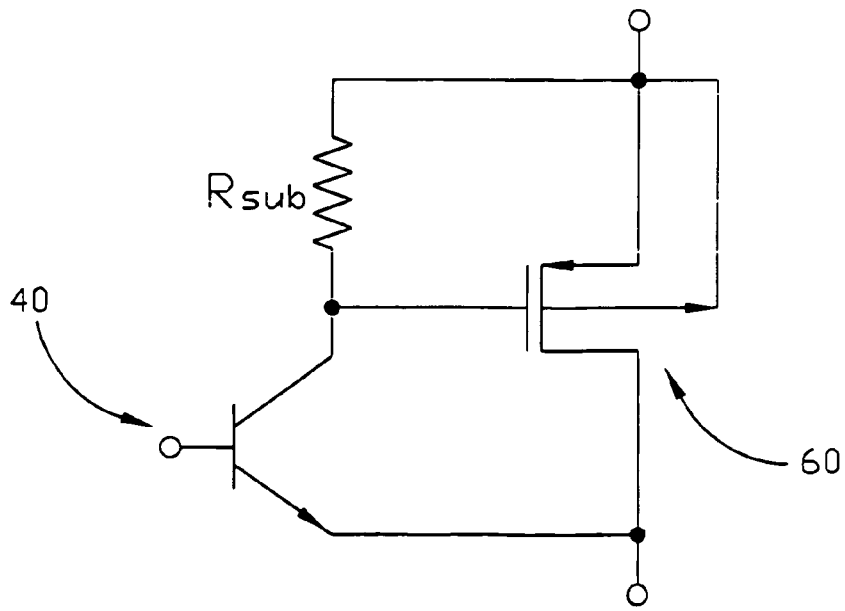
FIGS. 6A to 6C illustrate PMOS ESD protecting circuits.
Figure 6B:
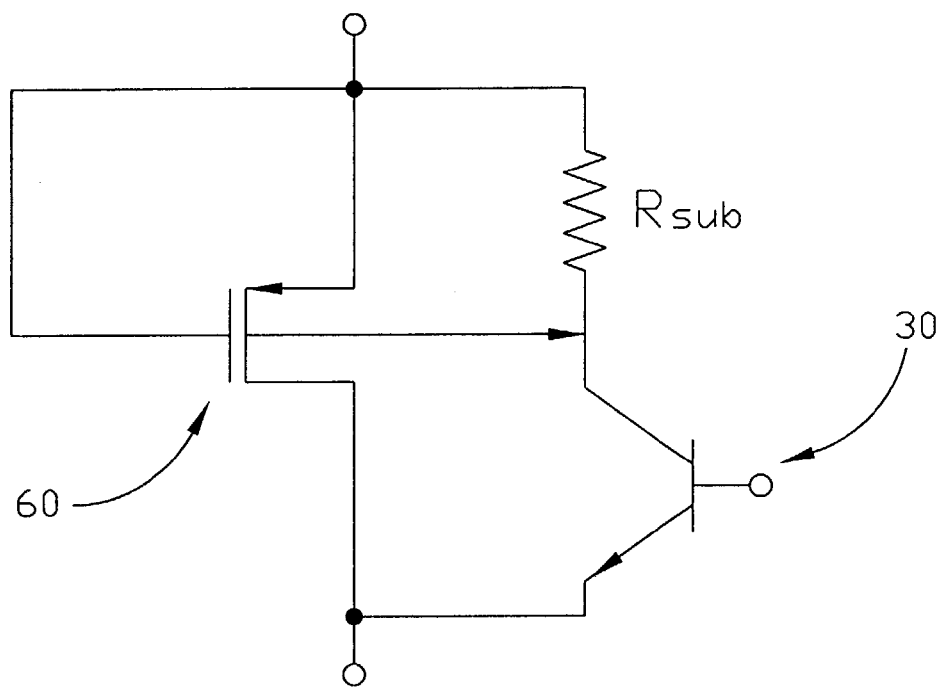
Figure 6C:
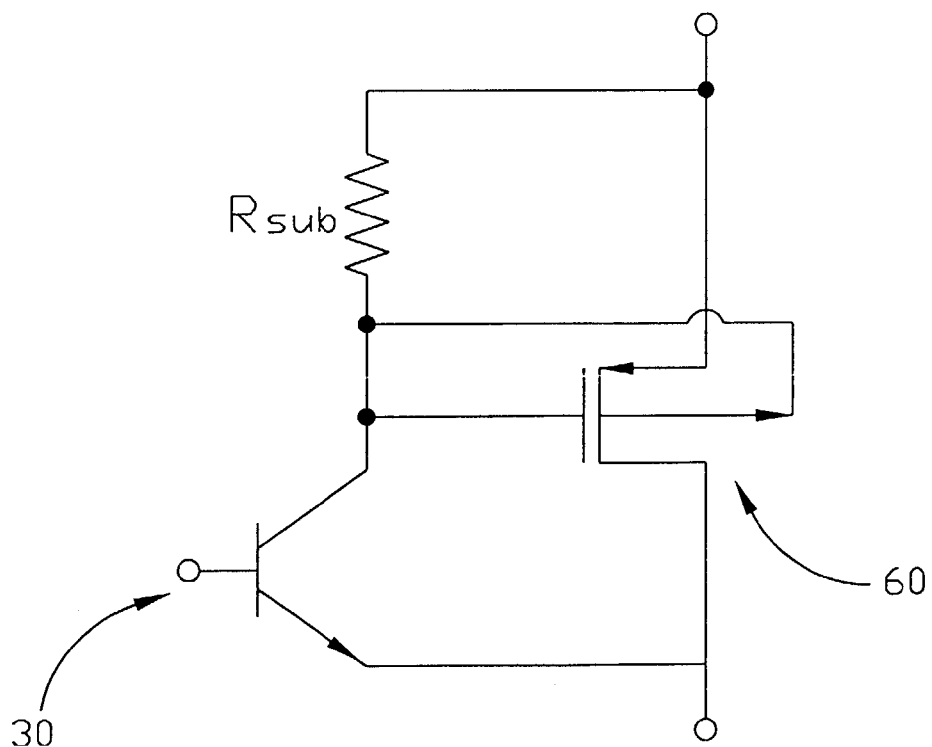

The embodiments mentioned above in accordance with the present invention can be utilized for ESD protection between not only VDD-VSS, but also input-VDD, input-VSS, etc. Further, replacing the NMOS with a PMOS can be utilized for ESD protection between VDD-output and VSS-output. The circuits of the gate trigger, the base trigger, and the gate/base trigger of the PMOS 60 are shown in FIG. 6A to FIG. 6C, respectively.

The present invention discloses an ESD protecting circuit that combines a BJT with a MOS. In accordance with the ESD protecting circuit, it has a lower triggering voltage. Moreover, employing the snapback status of the MOS makes electrostatic currents flow through the substrate of the MOS, and this makes the ESD protecting circuit sustain the heat caused from the ESD events. Furthermore, employing the BJT as a triggering element to trigger the MOS can avoid the problem of an undue layout area.

Although specific embodiments have been illustrated and described, it will be obvious to those skilled in the art that various modifications may be made without departing from what is intended to be limited solely by the appended claims.

What is claimed is:

1. An electrostatic discharge (ESD) protecting circuit for a BiCMOS, said ESD protecting circuit comprising:
   a metal oxide semiconductor (MOS) transistor;
   a bipolar junction transistor (BJT), wherein a base of said BJT is an open terminal said BJT is an N-type BJT, and a sinker is below a collector of said BJT to collect a current; and
   a resistor being connected with said BJT in a series connection and said series connection being further connected with said MOS transistor in parallel, wherein a contact of said resistor and said BJT is connected with said MOS transistor to make a voltage across said resistor drive an electrostatic current flowing through a parasitic BJT within said MOS transistor.

2. The circuit according to claim 1, wherein said MOS transistor is an NMOS transistor.

3. The circuit according to claim 2, wherein a terminal of said resistor is connected with a gate of said MOS transistor and another terminal of said resistor is connected with a source of said MOS transistor, and a substrate electrode of said MOS transistor is connected with said source.

4. The circuit according to claim 2, wherein said resistor is a substrate resistor, a terminal of said substrate resistor is connected with a source of said MOS transistor and another terminal of said substrate resistor is connected with a substrate electrode of said MOS transistor, and a gate of said MOS transistor is connected with said source.

5. The circuit according to claim 2, wherein said resistor is an substrate resistor, a terminal of said substrate resistor is connected with a gate of said MOS transistor and another terminal of said substrate resistor is connected with a source of said MOS transistor, and a substrate electrode of said MOS transistor is connected with said gate.

6. The circuit according to claim 1, wherein said MOS transistor is a PMOS transistor.

7. The circuit according to claim 6, wherein a terminal of said resistor is connected with a gate of said MOS transistor and another terminal of said resistor is connected with a drain of said MOS transistor, and a substrate electrode of said MOS transistor is connected with said drain.

8. The circuit according to claim 6, wherein said resistor is a substrate resistor, a terminal of said substrate resistor is connected with a drain of said MOS transistor and another terminal of said substrate resistor is connected with a substrate electrode of said MOS transistor, and a gate of said MOS transistor is connected with said drain.

9. The circuit according to claim 6, wherein said resistor is an substrate resistor, a terminal of said substrate resistor is connected with a gate of said MOS transistor and another terminal of said substrate resistor is connected with a drain of said MOS transistor, and a substrate electrode of said MOS transistor is connected with said gate.

10. The circuit according to claim 1, wherein a contact of said BJT and said MOS transistor is connected with a first positive voltage source.

11. The circuit according to claim 1, wherein a contact of said resistor and said MOS transistor is connected with a second positive voltage source.

12. The circuit according to claim 1, wherein said contact of said resistor and said MOS transistor is connected with a ground.

13. The circuit according to claim 1, wherein a contact of said BJT and said MOS transistor is connected with an input.

14. The circuit according to claim 1, wherein a contact of said BJT and said MOS transistor is connected with an output.

15. The circuit according to claim 1, wherein a contact of said resistor and said MOS transistor is connected with an input.

16. The circuit according to claim 1, wherein a contact of said resistor and said MOS transistor is connected with an output.

17. A method for electrostatic discharge (ESD) protection of a BiCMOS, said method comprising:
   passing an electrostatic current across a bipolar junction transistor (BJT) to make a voltage higher than a triggering voltage to lead out electrostatic current, wherein a base said BJT is an open terminal, said BJT is an N-type BJT, and a sinker is below a collector of said BJT to collect a current;
   providing said BJT with a resistor in a series connection;
   providing said series connection with a metal oxide semiconductor (MOS) transistor in parallel; and
   providing said resistor connected with said MOS transistor to make a voltage across said resistor drive said electrostatic current flowing through a parasitic BJT within said MOS transistor.

18. The method according to claim 17, wherein said MOS transistor is an NMOS transistor.

19. The method according to claim 18, further comprising: providing a terminal of said resistor connected with a gate of said MOS transistor; providing another terminal of said resistor connected with a source of said MOS transistor; and providing a substrate electrode of said MOS transistor connected with said source.

20. The method according to claim 18, wherein said resistor is a substrate resistor, said method further comprises: providing a terminal of said substrate resistor connected with a source of said MOS transistor; providing another terminal of said substrate resistor connected with a substrate electrode of said MOS transistor; and providing a gate of said MOS transistor connected with said source.

21. The method according to claim 18, wherein said resistor is a substrate resistor, said method further comprises: providing a terminal of said substrate resistor connected with a gate of said MOS transistor; providing another terminal of said substrate resistor connected with a source of said MOS transistor; and providing a substrate electrode of said MOS transistor connected with said gate.

22. The method according to claim 17, wherein said MOS transistor is a PMOS transistor.

23. The method according to claim 22, further comprising: providing a terminal of said resistor connected with a gate of said MOS transistor; providing another terminal of said resistor connected with a drain of said MOS transistor; and providing a substrate electrode of said MOS transistor connected with said drain.

24. The method according to claim 22, wherein said resistor is a substrate resistor, said method further comprises: providing a terminal of said substrate resistor connected with a drain of said MOS transistor; providing another terminal of said substrate resistor connected with a substrate electrode of said MOS transistor; and providing a gate of said MOS transistor connected with said drain.

25. The method according to claim 22, wherein said resistor is a substrate resistor, said method further comprises: providing a terminal said substrate resistor connected with a gate of said MOS transistor; providing another terminal of said substrate resistor connected with a drain of said MOS transistor; and providing a substrate electrode of said MOS transistor connected with said gate.

* * * * *